(12) United States Patent
Shen

(10) Patent No.: US 6,420,210 B2
(45) Date of Patent: Jul. 16, 2002

(54) SEMICONDUCTOR DEVICE AND METHOD FOR MANUFACTURING THE SAME

(75) Inventor: Ming-Tung Shen, Taipei (TW)

(73) Assignee: Computech International Ventures Limited (HK)

( * ) Notice: Subject to any disclaimer, the term of this patent is extended or adjusted under 35 U.S.C. 154(b) by 0 days.

(21) Appl. No.: 09/811,795

(22) Filed: Mar. 19, 2001

Related U.S. Application Data

(62) Division of application No. 09/329,599, filed on Jun. 10, 1999, now Pat. No. 6,278,183.

(30) Foreign Application Priority Data

Apr. 16, 1999 (TW) .......................................... 88106140

(51) Int. Cl.[7] .......................... H01L 21/44; H01L 21/48; H01L 21/50
(52) U.S. Cl. ........................................ 438/108; 438/119
(58) Field of Search ................................ 438/108, 119; 257/737, 698; 156/329, 330

(56) References Cited

U.S. PATENT DOCUMENTS

| 5,394,303 A | 2/1995 | Yamaji | 361/749 |
| 5,468,681 A | 11/1995 | Pasch | 437/183 |
| 5,776,799 A | * 7/1998 | Song et al. | |

FOREIGN PATENT DOCUMENTS

| EP | 0329317 | 8/1989 |
| EP | 0740340 | 10/1996 |
| JP | 58035935 | 3/1983 |
| JP | 2058793 | 10/1990 |
| JP | 4199723 | 7/1992 |
| JP | 5347328 | 12/1993 |
| JP | 7240434 | 9/1995 |
| JP | 8148494 | 6/1996 |
| WO | 9205582 | 4/1992 |
| WO | 9857370 | 12/1998 |

OTHER PUBLICATIONS

Patent Abstracts of Japan JP 04199723 dated Jul. 20, 1992.
English Abstract of WO 98/57370 Dated Dec. 17,1998.
Burdick, B. et al. "Extension of The Chip–On–Flex Technology to Known Good Die." International Journal of Microcircuits and Electronic Packaging Society, vol. 19, No. 4, (1996) pp. 435–440.
English Abstract of JP 5347328 Dated Dec. 27, 1993.
English Abstract of Equivalent JP 2058793 Patent of JP 58035935 Dated Mar. 2, 1983.
English Abstract of JP 8148494 Date Jun. 7, 1996.
English Abstract of JP 7240434 Dated Sep. 12, 1995.

* cited by examiner

*Primary Examiner*—David E. Graybill
(74) *Attorney, Agent, or Firm*—Ladas & Parry

(57) ABSTRACT

A semiconductor device includes a semiconductor chip, a dielectric tape layer and a printed circuit board. The semiconductor chip has a pad mounting surface with a plurality of bonding pads provided thereon. The dielectric tape layer has opposite first and second adhesive surfaces. The first adhesive surface is adhered onto the pad mounting surface of the semiconductor chip. The dielectric tape layer is formed with a plurality of holes at positions registered with the bonding pads to expose the bonding pads. Each of the holes is confined by a wall that cooperates with a registered one of the bonding pads to form a contact receiving space. A plurality of conductive contacts are placed in the contact receiving spaces, respectively. The printed circuit board has a circuit layout surface adhered onto the second adhesive surface of the dielectric tape layer. The circuit layout surface is formed with circuit traces that are bonded to the conductive contacts to establish electrical connection with the bonding pads. A method for manufacturing the semiconductor device is also disclosed.

5 Claims, 4 Drawing Sheets

SEMICONDUCTOR DEVICE AND METHOD FOR MANUFACTURING THE SAME

This application is a division of Ser. No. 09/329,599, filed Jun. 10, 1999, now U.S. Pat. No. 6,278,183.

BACKGROUND OF THE INVENTION

1. Field of the Invention

The invention relates to a semiconductor device and method for manufacturing the same, more particularly to a semiconductor device that can be produced at a relatively low manufacturing cost and with a relatively high production yield.

2. Description of the Related Art

Referring to FIGS. 1 and 2, a conventional semiconductor device 1 is shown to comprise a semiconductor chip 10, a dielectric tape layer 2 and a printed circuit board 3.

The semiconductor chip 10 has a pad mounting surface 12 with a plurality of bonding pads 11 provided thereon. The dielectric tape layer 2 has an adhesive surface 21 adhered onto the pad mounting surface 12 of the semiconductor chip 10, and a plurality of holes 20 that are registered with the bonding pads 11 to expose the latter. The dielectric tape layer 2 further has a wire mounting surface 22 opposite to the adhesive surface 21. A plurality of wires 23 that traverse the holes 20 are disposed on the wire mounting surface 22. A wire-bonding machine (not shown) processes the portions of the wires 23 that traverse the holes 20 (in the direction of the arrows shown in FIG. 1) so as to bond the wires 23 to the bonding pads 11 in the holes 20. Solder balls 24 are subsequently formed on the wires 23. The printed circuit board 3 has a circuit layout surface 30 formed with circuit traces 31 that bond with the solder balls 24 to establish electrical connection between the circuit traces 31 and the bonding pads 11 via the solder balls 24 and the wires 23.

Some of the drawbacks of the conventional semiconductor device 1 are as follows:

1. An expensive wire-bonding machine is needed to establish connection between the wires 23 and the bonding pads 11, thereby increasing the production costs. Also, defective products are produced during the wire-bonding operation due to inadequacies of the latter. Particularly, defective products are formed when wires break during the wire-bonding operation, thereby reducing the production yield.

2. The wires 23 are susceptible to oxidation and corrosion because they are exposed to air, thereby affecting reliability of the semiconductor device 1.

3. Solder balls 24 are needed to establish connection between the circuit traces 31 on the printed circuit board 3 and the semiconductor chip 10. The solder balls 24 are liable to drop off or form unstable electrical contacts, thereby affecting adversely the production yield.

4. Because solder balls 24 are used to connect the printed circuit board 3 and the semiconductor chip 10, the contact area between the printed circuit board 3 and the semiconductor chip 10 is relatively small and can lead to eventual undesired separation between the printed circuit board 3 and the semiconductor chip 10.

SUMMARY OF THE INVENTION

Therefore, the main object of the present invention is to provide a semiconductor device and a method for manufacturing a semiconductor device capable of overcoming the aforesaid drawbacks that are associated with the prior art.

According to one aspect of the present invention, a semiconductor device comprises:

a semiconductor chip having a pad mounting surface with a plurality of bonding pads provided thereon;

a dielectric tape layer having opposite first and second adhesive surfaces, the first adhesive surface being adhered onto the pad mounting surface of the semiconductor chip, the dielectric tape layer being formed with a plurality of holes at positions registered with the bonding pads to expose the bonding pads, each of the holes being confined by a wall that cooperates with a registered one of the bonding pads to form a contact receiving space;

a plurality of conductive contacts placed in the contact receiving spaces, respectively; and a printed circuit board having a circuit layout surface adhered onto the second adhesive surface of the dielectric tape layer, the circuit layout surface being formed with circuit traces that are bonded to the conductive contacts to establish electrical connection with the bonding pads.

According to another aspect of the present invention, a method for manufacturing a semiconductor device comprises:

adhering a first adhesive surface of a dielectric tape layer onto a pad mounting surface of a semiconductor chip, the dielectric tape layer being formed with a plurality of holes at positions registered with bonding pads provided on the pad mounting surface to expose the bonding pads, each of the holes being confined by a wall that cooperates with a registered one of the bonding pads to form a contact receiving space;

placing a plurality of conductive contacts in the contact receiving spaces, respectively; and adhering a circuit layout surface of a printed circuit board onto a second adhesive surface of the dielectric tape layer opposite to the first adhesive surface, and bonding circuit traces formed on the circuit layout surface to the conductive contacts to establish electrical connection with the bonding pads.

Preferably, the second adhesive surface is provided with a heat-curable adhesive having a curing point that is lower than melting point of the conductive contacts. Thus, adhering of the printed circuit board onto the dielectric tape layer and bonding of the circuit traces to the conductive contacts can be performed simultaneously via a heat curing operation such that the circuit layout surface is already adhered onto the second adhesive layer prior to melting of the conductive contacts.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
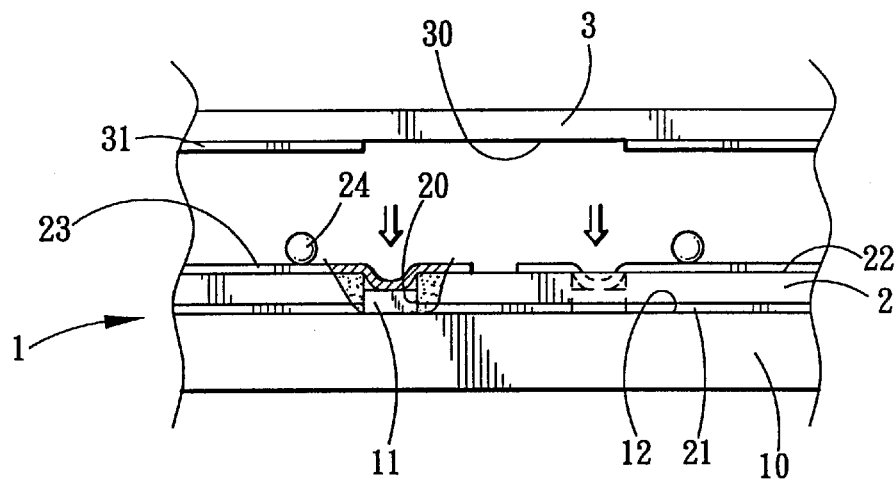
FIG. 1 is a partly exploded fragmentary schematic view illustrating a conventional semiconductor device.
Figure 2:
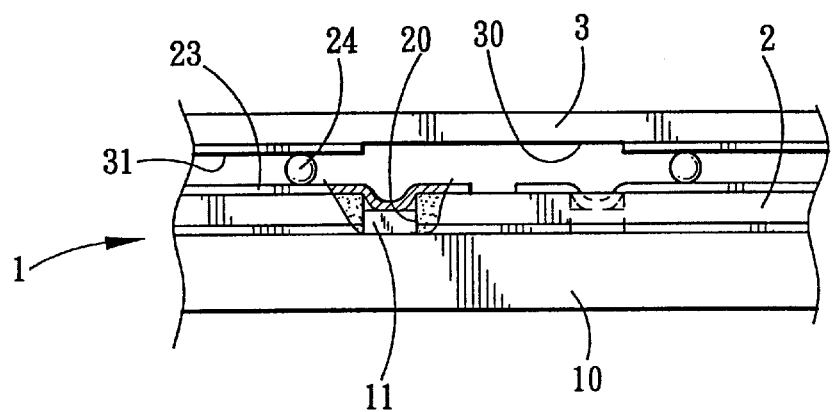
FIG. 2 is a fragmentary schematic view of the conventional semiconductor device of FIG. 1.
Figure 3:
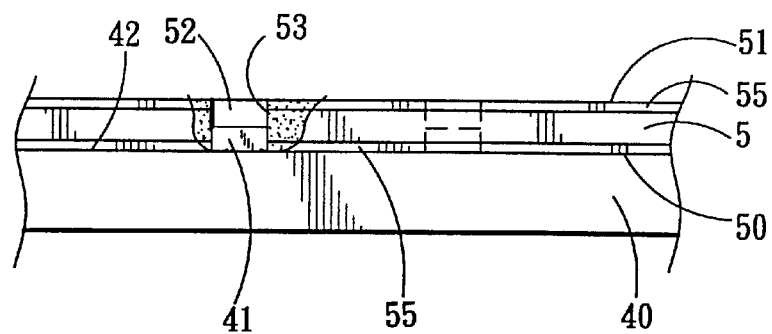
FIGS. 3 to 5 are fragmentary schematic views illustrating the steps of the method for manufacturing the first preferred embodiment of a semiconductor device according to the present invention.
Figure 4:
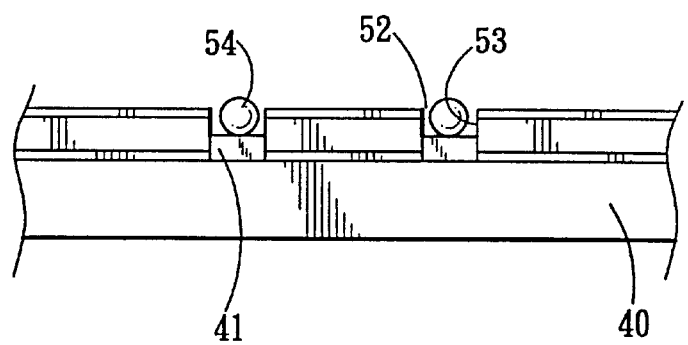
Figure 5:
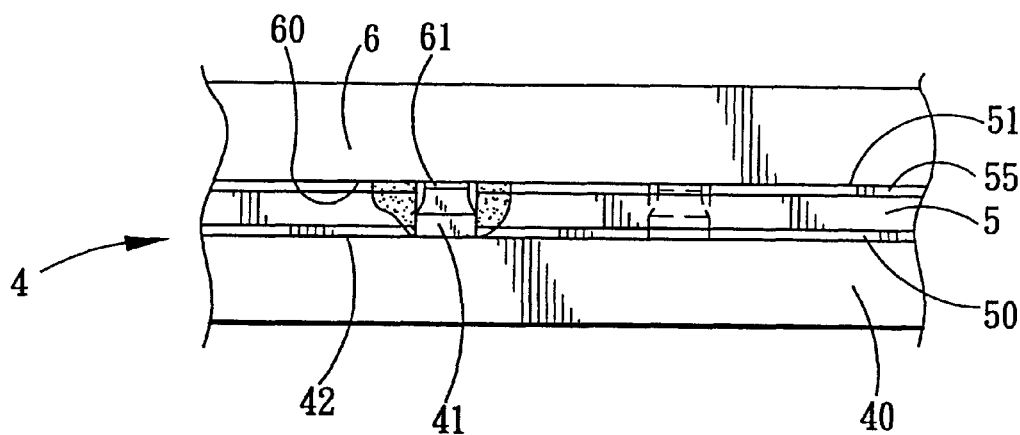

Referring to FIGS. 3 to 5, the first preferred embodiment of a semiconductor device 4 according to the present invention is shown to comprise a semiconductor chip 40, a dielectric tape layer 5 and a printed circuit board 6.

The semiconductor chip 40 has a pad mounting surface 42 with a plurality of bonding pads 41 provided thereon. The dielectric tape layer 5 has opposite first and second adhesive surfaces 50, 51. A heat-curable adhesive 55 is provided on the first adhesive surface 50 such that the first adhesive surface 50 can be adhered onto the pad mounting surface 42 of the semiconductor chip 40 during a heat curing operation. A conventional laser cutting technique is employed to form a plurality of holes 52 in the dielectric tape layer 5 at positions registered with the bonding pads 41 to expose the latter.

Each of the holes 52 is confined by a wall 53 that cooperates with a registered one of the bonding pads 41 to form a contact receiving space. A plurality of conductive contacts 54 are placed in the contact receiving spaces, respectively. In this embodiment, a tin ball is planted in each contact receiving space and serves as a conductive contact 54.

The printed circuit board 6 has a circuit layout surface 60 formed with circuit traces 61 that are to be connected to the conductive contacts 54. A heat curing operation is conducted to bond the conductive contacts 54 to the circuit traces 61, and to adhere the circuit layout surface 60 onto the second adhesive surface 51 of the dielectric tape layer 50. Preferably, the second adhesive surface 51 is provided with a heat-curable adhesive 55 having a curing point that is lower than the melting point of the conductive contacts 54. Thus, the circuit layout surface 60 is already adhered onto the second adhesive surface 51 prior to melting of the conductive contacts 54, thereby sealing the contact receiving spaces so that the melt of each conductive contact 54 is prevented from flowing out of the respective contact receiving space to avoid formation of undesired connections with adjacent conductive contacts 54.

Figure 6:
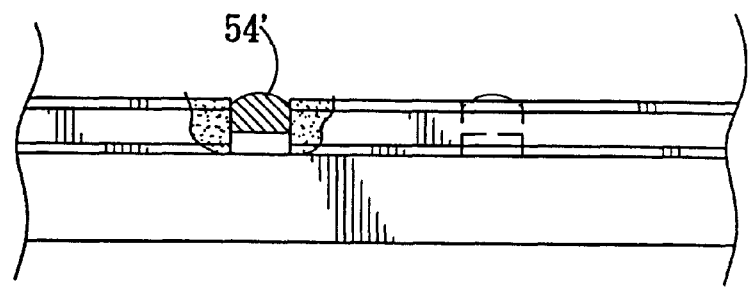
FIG. 6 is a fragmentary schematic view illustrating an intermediate product of the second preferred embodiment of a method for manufacturing a semiconductor device according to the present invention.

Referring to FIG. 6, in the second preferred embodiment of a semiconductor device according to the present invention, instead of using tin balls as conductive contacts, each contact 54' is formed from conductive paste, such as conductive silver paste.

Figure 7:
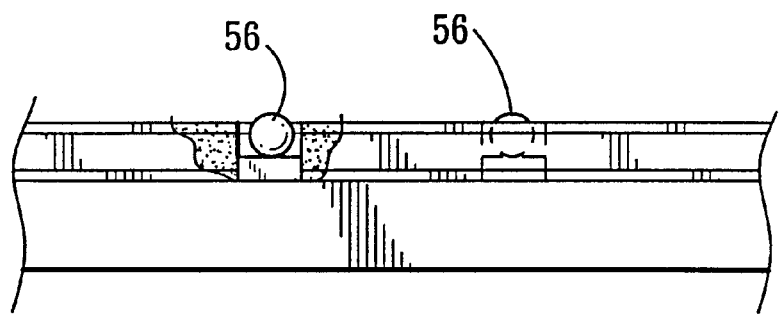
FIGS. 7 and 8 are fragmentary schematic views illustrating some of the steps of the method for manufacturing the third preferred embodiment of a semiconductor device according to the present invention.
Figure 8:
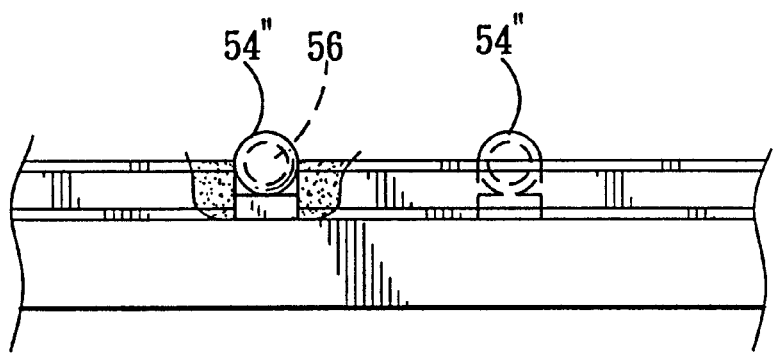

Referring to FIGS. 7 and 8, in the third preferred embodiment of a semiconductor device according to the present invention, each contact 54" is formed by placing a conductive metal material 56, such as a gold or aluminum ball, in each contact receiving space. A chemical electroplating process is subsequently performed to complete each contact 54" prior to bonding with the circuit traces on the printed circuit board (not shown).

While the preferred embodiments as hereinbefore described involve only one semiconductor chip 40 on the printed circuit board 6, it should be noted that, in practice, two or more semiconductor chips 40 may be mounted on the printed circuit board 6 according to the actual requirements.

Some of the advantageous attributes of the semiconductor device 4 according to this invention are as follows:

1. Since no wire-bonding machine is required, the production costs can be dramatically reduced. Moreover, the adverse effects of wire bonding on the production yield of the semiconductor device 4 are also eliminated.

2. Because the conductive contacts 54, 54', 54" are sealingly confined by the printed circuit board 6 and the dielectric tape layer 5, the conductive contacts 54, 54', 54" can be protected from oxidation and corrosion.

3. Because no solder balls are present between the circuit layout surface 60 of the printed circuit board 6 and the second adhesive surface 51 of the dielectric tape layer 5, the printed circuit board 6 can be mounted directly on the dielectric tape layer 5 with a relatively large contact area therebetween to prevent undesired separation of the printed circuit board 6 from the dielectric tape layer 5.

4. Due to the design of the conductive contacts 54, 54', 54" in the semiconductor device 4 of this invention, the production yield can be substantially higher as compared to the conventional semiconductor device that uses solder balls.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A method for manufacturing a semiconductor device, comprising:

adhering a first adhesive surface of a dielectric tape layer onto a pad mounting surface of a semiconductor chip, the dielectric tape layer being formed with a plurality of holes at positions registered with bonding pads provided on the pad mounting surface to expose the bonding pads, each of the holes being confined by a wall that cooperates with a registered one of the bonding pads to form a contact receiving space;

placing a plurality of conductive contacts in the contact receiving spaces, respectively; and adhering a circuit layout surface of a printed circuit board onto a second adhesive surface of the dielectric tape layer opposite to the first adhesive surface, and bonding circuit traces formed on the circuit layout surface to the conductive contacts to establish electrical connection with the bonding pads, wherein the second adhesive surface is provided with a heat-curable adhesive having a curing point that is lower than a melting point of the conductive contacts, and adhering of the printed circuit board onto the dielectric tape layer and bonding of the circuit traces to the conductive contacts are performed simultaneously through a heat curing operation such that the circuit layout surface is already adhered onto the second adhesive surface prior to melting of the conductive contacts.

2. The method as claimed in claim 1, wherein adhering of the dielectric tape layer onto the semiconductor chip is accomplished by heat curing of a heat-curable adhesive provided on the first adhesive surface.

3. The method as claimed in claim 1, wherein each of the conductive contacts is a tin ball.

4. The method as claimed in claim 1, wherein each of the conductive contacts is formed from conductive paste.

5. The method as claimed in claim 1, wherein each of the conductive contacts is formed from a conductive material that undergoes chemical electroplating prior to bonding with the circuit traces.

* * * * *